(12) United States Patent
Wu et al.

(10) Patent No.: US 10,204,702 B2
(45) Date of Patent: Feb. 12, 2019

(54) TESTING A STORAGE NETWORK

(71) Applicant: EMC Corporation, Hopkinton, MA (US)

(72) Inventors: Chao Wu, Shanghai (CN); Li Zhai, Shanghai (CN); Bryan Xiaoguang Fu, Shanghai (CN); Hongtao Zhang, Shanghai (CN); Andrew Anzhou Hou, Shanghai (CN)

(73) Assignee: EMC IP Holding Company LLC, Hopkinton, MA (US)

( * ) Notice: Subject to any disclaimer, the term of this patent is extended or adjusted under 35 U.S.C. 154(b) by 0 days.

(21) Appl. No.: 15/097,589

(22) Filed: Apr. 13, 2016

(65) Prior Publication Data

US 2016/0307643 A1   Oct. 20, 2016

(30) Foreign Application Priority Data

Apr. 17, 2015   (CN) .......................... 2015 1 0185152

(51) Int. Cl.
*G11C 29/00* (2006.01)
*G11C 29/56* (2006.01)

(52) U.S. Cl.
CPC ................... *G11C 29/56* (2013.01)

(58) Field of Classification Search
CPC ....... G11C 29/56; G06F 11/2294; G06F 8/70; G06F 8/76; H04L 43/50; H04M 3/2254; H04M 1/24; H04M 1/72525; H04M 1/72544; H04Q 11/045; H04Q 3/0087; H04Q 2213/13103; H04Q 2213/1316; G01R 31/318505; G01R 31/318511; G01R 31/31905; G01R 31/31924
See application file for complete search history.

(56) References Cited

U.S. PATENT DOCUMENTS

| | | | | |
|---|---|---|---|---|
| 5,854,889 A | * | 12/1998 | Liese ...................... | H04L 43/50 714/32 |
| 6,665,626 B2 | * | 12/2003 | Hsieh .................. | G06F 11/2294 455/48 |
| 8,595,680 B1 | * | 11/2013 | Steinberg ............ | G06F 17/5022 211/105 |
| 9,626,284 B2 | * | 4/2017 | Xue .................... | G06F 11/3672 |
| 9,720,818 B2 | * | 8/2017 | Edmonds ............ | G06F 11/3688 |
| 2002/0128793 A1 | * | 9/2002 | Hornberger ......... | G06F 11/2294 702/108 |
| 2003/0076125 A1 | * | 4/2003 | McCord ......... | G01R 31/318505 324/754.07 |
| 2004/0255201 A1 | * | 12/2004 | Liu ..................... | G06F 11/2294 714/43 |
| 2005/0262409 A1 | * | 11/2005 | Wang ............ | G01R 31/318342 714/738 |

(Continued)

*Primary Examiner* — Guerrier Merant
(74) *Attorney, Agent, or Firm* — BainwoodHuang

(57) ABSTRACT

Embodiments of the present disclosure provide an apparatus for testing a storage network comprising a processor configured to generate a configuration signal in response to a test request; and a tester coupled to the processor and configured to, by the configuration signal, operate under different operation modes so as to test different to-be-tested objects in the storage network. The test request indicates an operation mode of the tester, wherein various types of to-be-tested objects in a storage network can be tested by one test device, at a low test cost and with more convenient operations.

18 Claims, 4 Drawing Sheets

(56) References Cited

U.S. PATENT DOCUMENTS

| | | | | |
|---|---|---|---|---|
| 2006/0277231 A1* | 12/2006 | Kral | ................... | G06F 8/70 |
| | | | | 708/102 |
| 2009/0292949 A1* | 11/2009 | Quach | ................ | G06F 11/2284 |
| | | | | 714/36 |
| 2014/0282327 A1* | 9/2014 | Mehta | ............. | G01R 31/31707 |
| | | | | 716/112 |
| 2014/0331209 A1* | 11/2014 | Singh | ................ | G06F 11/3688 |
| | | | | 717/127 |

* cited by examiner

TESTING A STORAGE NETWORK

RELATED APPLICATION

This application claim priority from Chinese Patent Application Number CN2015101851528, filed on Apr. 17, 2015 at the State Intellectual Property Office, China, titled "APPARATUS AND METHOD FOR TESTING A STORAGE NETWORK," the contents of which is herein incorporated by reference in entirety.

DISCLAIMER

Portions of this patent document/disclosure may contain command formats and other computer language listings, all of which are subject to copyright protection. The copyright owner has no objection to the facsimile reproduction by anyone of the patent document or the patent disclosure, as it appears in the Patent and Trademark Office patent file or records, but otherwise reserves all copyright rights whatsoever.

FIELD OF INVENTION

Embodiments of the present disclosure relate to storage technology.

BACKGROUND OF THE INVENTION

Typically, a storage network may consist of one or more servers as well as a storage system that may be accessible to servers. Usually, in order to expand the scale of a storage network, a plurality of servers may be coupled to a storage system by means of one or more storage expansion devices.

Usually, in research & development of a new equipment, an equipment manufacturer produces a batch of test products for test, and after passing the test, the equipment manufacturer may launch mass production. Currently, different devices in a storage network may be manufactured by different manufacturers. For example, servers may be manufactured by a server manufacturer, while physical storage devices in a storage system may be manufactured by a storage device manufacturer. Thereby, different manufacturers may leverage respective test devices to test their respective products. After organizing devices into the storage network, it may be inefficient to test respective devices by different test devices that may be used by different device manufacturers in research & development.

SUMMARY OF THE INVENTION

Example embodiments of the present disclosure propose a technical solution for testing various types of to-be-tested objects in a storage network by using a tester which has configurable operation modes. In one embodiment there is an apparatus for testing a storage network, which may include a processor that may be configured to generate a configuration signal in response to a test request; and a tester coupled to the processor and configured to, by the configuration signal, operate under different operation modes so as to test different to-be-tested objects in the storage network, and a test request indicates an operation mode of the tester.

BRIEF DESCRIPTION OF THE DRAWINGS

Principles of the present disclosure are described below by means of several exemplary embodiments as shown in the accompanying drawings. It should be understood that these embodiments are described only for enabling those skilled in the art to better understand and further implement the present invention, rather for limiting the scope of the present invention in any manner.

DETAILED DESCRIPTION

Figure 1:
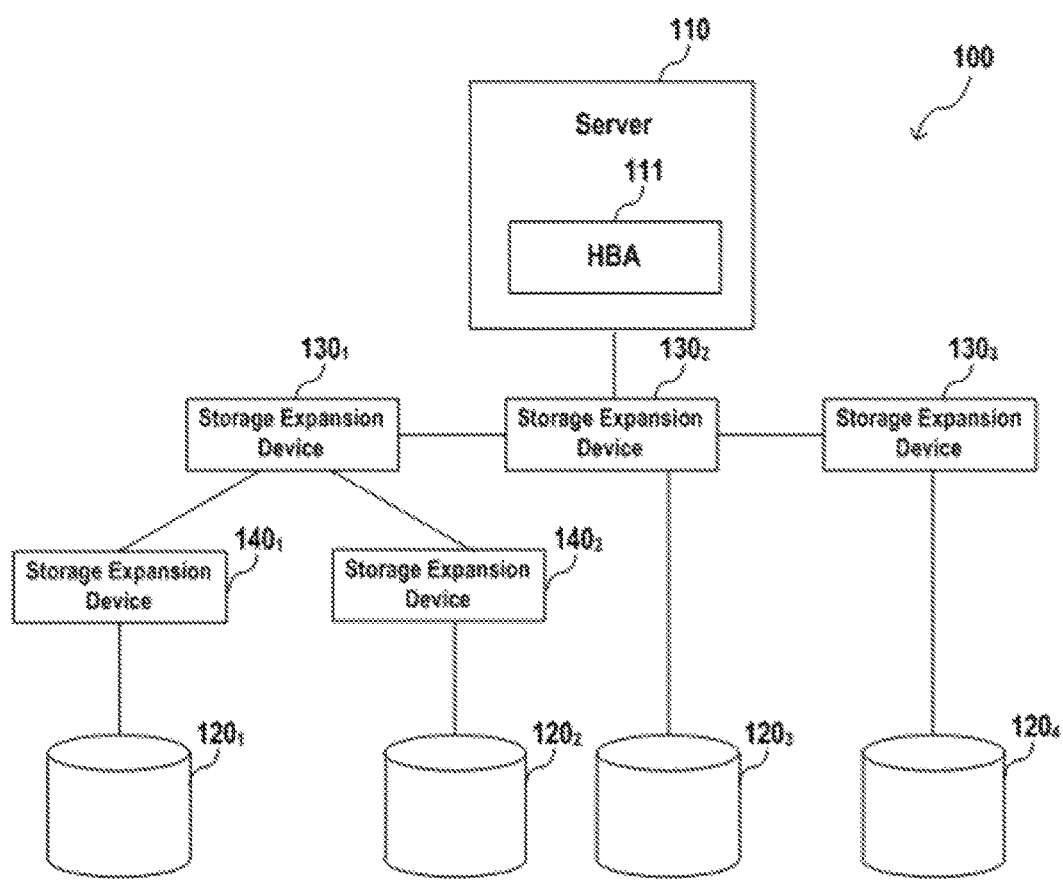
FIG. 1 schematically shows an exemplary architecture of a conventional storage network.

Principles of the present disclosure are described below by means of several exemplary embodiments as shown in the accompanying drawings. It should be understood that these embodiments are described only for enabling those skilled in the art to better understand and further implement the present invention, rather for limiting the scope of the present invention in any manner.

References in the specification to "one embodiment", "an embodiment", "a preferred embodiment" etc., indicate that the embodiment described may include a particular feature, structure, or characteristic, but every embodiment may not necessarily include the particular feature, structure, or characteristic. Moreover, such phrases are not necessarily referring to the same embodiment. It should also be understood that various terminology used herein is for the purpose of describing particular embodiments only and is not intended to be liming of the disclosure. As used herein, the singular forms "a", "an" and "the" may include the plural forms, unless the context clearly indicates otherwise. It will be further understood that the terms "comprises", "has" and "including" used herein, specify the presence of stated features, elements, and/or components etc., but do not preclude the presence of one or more other features, elements, components and/or combinations thereof. For example, the term "multiple" used here indicates "two or more"; the term "and/or" used here may comprise any or all combinations of one or more of the items listed in parallel. Definitions of other terms will be specifically provided in the following description. Furthermore, in the following description, some functions or structures well-known to those skilled in the art will be omitted in order not to obscure embodiments of the disclosure in the unnecessary details.

Example embodiments of the present disclosure propose a technical solution for testing various types of to-be-tested objects in a storage network by using a tester which has configurable operation modes. One embodiment may include an apparatus for testing a storage network. In a further embodiment apparatus may include a processor that may be configured to generate a configuration signal in response to a test request. In a further embodiment, a tester may be coupled to a processor and may be configured to, by a configuration signal, operate under different operation modes to test different to-be-tested objects in a storage network. In a further embodiment a test request may indicate an operation mode of a tester.

In one embodiment, a tester may be further configured to simulate, under one of the operation modes, at least one to-be-tested object of to-be-tested objects to test other to-betested objects communicating with a simulated to-be-tested object. In one embodiment, a tester may be further configured to, under one of the operation modes, simulate two to-be-tested objects of to-be-tested objects to test other to-be-tested objects communicating with two simulated to-be-tested objects. In one embodiment, a tester may be further configured to support protocols for communications between different to-be-tested objects.

In one embodiment, a tester may include at least one test port that may be configured to transfer a test signal to the to-be-tested objects and/or receive a response to a test signal from the to-be-tested objects. In a further embodiment, each of the test ports may be associated with one of the operation modes. In one embodiment, test ports may include one of: a Serial Attached Small Computer System Interface (SAS) port, a Fibre Channel (FC) port, and a Serial Advanced Technology Attachment (SATA) port. In one embodiment, a processor may include an embedded processor.

In one embodiment, to-be-tested objects may at least include two of: a host bus adapter (HBA); a physical storage device; and a storage expansion device coupled between a host bus adapter and a physical storage device.

In one embodiment, there may be provided a method for testing a storage network. In a further embodiment, the method includes generating a configuration signal in response to a test request. In a further embodiment, the method includes configuring a tester, by a configuration signal, to operate under different operation modes so as to test different to-be-tested objects in the storage network, wherein a test request indicates an operation mode of a tester.

In a further embodiment a computer program product being tangibly stored on a non-transient computer readable storage medium and including computer executable instructions which, when executed, cause a machine to execute steps of the method described above. With the solution according to the present disclosure, various types of to-be-tested objects in a storage network may be tested by one test device, at a low test cost and with more convenient operations.

FIG. 1 shows an illustrative architecture of a conventional storage network 100. As shown in FIG. 1, storage network 100 includes server 110 and a storage system capable of communicating with server 110. Server 110 includes a host bus adapter (HBA) 111. HBA 111 is configured to enable conversion between an internal channel protocol (e.g., PCI protocol) of server 110 and an I/O channel protocol of the storage system. Examples of I/O channel protocol of the storage system include, but are not limited to: Serial Attached Small Computer System Interface (SAS) Protocol, Fibre Channel (FC) Protocol, and Serial Advanced Technology Attachment (SATA) Protocol.

The storage system includes physical storage devices $120_1$, $120_2$, $120_3$, $120_4$ and $120_5$ (collectively called physical storage device 120). As one example, the physical storage device is a hard disk drive (HDD). To expand the scale of storage network 100, one or more mutually cascaded storage expansion devices $130_1$, $130_2$ and $130_3$ (collectively called storage expansion device 130) and storage expansion devices $140_1$ and $140_2$ (collectively called storage expansion device 140) may be coupled between server 110 and the storage system. Storage expansion device 130 and/or 140 is usually further configured to route a command and/or data received from server 110 to a corresponding physical storage device 120. As one example, storage expansion device 130 and/or 140 is a switch.

It should be understood that for the clarity purpose, only one server 110 is shown in FIG. 1. According to actual needs, however, there may exist a plurality of servers 110 accessing the storage system. In addition, for purpose of illustration, only one physical storage device 120 is disposed on each drive spindle in FIG. 1. To save space, however, a plurality of physical storage devices 120 may be disposed on each drive spindle.

Server 110 and physical storage device 120 may communicate with each other based on any appropriate protocol. Examples of the protocol include, but are not limited to: SAS Protocol, FC Protocol, and SATA Protocol.

In the example of the SAS Protocol, since server 110 acts as an initiating device of an I/O command and/or data, it is also called an initiator. In addition, since physical storage device 120 acts as a recipient of an I/O command and/or data, it is also called a target. Furthermore, storage expansion device 130 and/or 140 is also called an expander.

After server 110, storage expansion device 130 and/or 140 as well as physical storage device 120 are organized into storage network 100, typically performance tests are required for them. However, it is rather inefficient to test server 110, storage expansion device 130 and/or 140 as well as physical storage device 120 by different test devices, which are used by their respective manufacturers in research & development. Therefore, there is a desire for a high efficient solution with which various types of to-be-tested objects in a storage network may be tested by a single test device.

In addition, test devices used by manufacturers are merely applicable to research & development but not to usage phases later. For example, in the process of organizing a plurality of physical storage devices 120 into storage network 100, these physical storage devices 120 have to be encapsulated. In this case, if encapsulated physical storage devices 120 are tested by test devices used by manufacturers, encapsulation has to be broken, thereby increasing cost of testing and compounding test complexity. Therefore, it may be desirable to provide a low-cost and more convenient solution. Accordingly, an apparatus for testing various types of to-be-tested objects in a storage network by a mode-configurable tester is disclosed.

Figure 2:
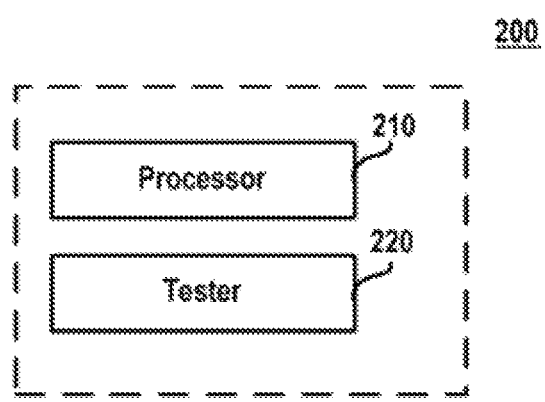
FIG. 2 schematically shows an exemplary block diagram of an apparatus for testing a storage network according to one embodiment of the present disclosure.

FIG. 2 shows a block diagram of apparatus 200 for testing a storage network according to one embodiment of the present invention. As shown in FIG. 2, apparatus 200 comprises processor 210 and tester 220 coupled to processor 210. The term "couple" as used in this specification comprises direct connection or indirect connection via middleware(s).

In one embodiment, processor 210 may be implemented as an embedded processor. In a further embodiment an "embedded processor" may be relative to a general-purpose computer processor and may typically refer to a processor which may be designed to execute one or more dedicated functions. In a further example embodiment, an embedded processor may include, but not limited to: Embedded Micro Processor Unit (MPU), Embedded Microcontroller Unit (MCU), Embedded Digital Signal Processor (EDSP), and Embedded System on Chip (SoC). In a further embodiment, an embedded processor may have such advantages as small volume, convenience for integration with other module and the like, where the embedded processor may be used, apparatus 200 may also have a small volume and thus may be portable. In a further embodiment, it should be understood that processor 210 may be implemented in any appropriate manner that is known in the art or to be developed later, and the scope of the present invention is not limited in this regard.

In a further embodiment, processor 210 may be configured to generate a configuration signal in response to a test request. In one embodiment, apparatus 200 may further include an input/output device (not shown), via which processor 210 may obtain a test request from a testing operator. In a further embodiment, as one example, an input/output device may include a keypad, for example, a speed dial keypad. In a further embodiment, a testing operator may send a test request to processor 210 by pressing a predetermined key or a combination of predetermined keys on a keypad. In a further embodiment, as one example, an input/output device may include a touch screen display. In a further embodiment, a testing operator may send a test request to processor 210 by touching a predetermined icon presented on a touch screen display. In a further embodiment, a processor 210 may obtain a test request via an input/output device.

Additionally or alternatively, in another embodiment, apparatus 200 may include a communication interface (not shown), via which processor 210 obtains a test request from a specific computing device, for example, a desktop computer (PC), a laptop computer, a tablet computer or a mobile phone, etc. In a further embodiment a communication interface may include a serial communication interface and/or a parallel communication interface. In a further embodiment, examples of communication interface may include, but are not limited to: an Ethernet interface, a USB interface, a Universal Asynchronous Receiver/Transmitter (UART) interface. In a further embodiment, processor 210 may obtain a test request in any appropriate way, and the scope of the present disclosure is not limited in this embodiment.

In various embodiments of the present disclosure, a test request obtained by processor 210 may indicate what operation mode a tester 220 will be configured to. In an example embodiment, where apparatus 200 may include a keypad as described above, a predetermined key or a combination of predetermined key on a keypad may be associated with corresponding operation modes of tester 220. In a further embodiment, a testing operator may press a predetermined key or a combination of predetermined key so as to indicate to configure tester 220 to be in a corresponding operation mode. In an example embodiment, a combination of keys "123" may be associated with a first operation mode of tester 220, and thus a testing operator may press the combination of keys "123" so as to indicate to configure tester 220 to be in a first operation mode.

In another example embodiment, where apparatus 200 may include a touch screen display, just as described above, predetermined icons on a touch screen display may be associated with corresponding operation modes of tester 220. In a further embodiment, a testing operator may touch a predetermined icon so as to indicate to configure tester 220 to be in a corresponding operation mode. In an example embodiment, an icon "disk" may be associated with a first operation mode of tester 220, and thus a testing operator may touch an icon "disk" so as to indicate to configure tester 220 to be in a first operation mode.

In various embodiments of the present disclosure, processor 210 may parse an obtained test request to generate a corresponding configuration signal, by which tester 220 may be configured to operate under different operation modes so as to test different to-be-tested objects in a storage network.

In one embodiment, tester 220 may include one or more test interfaces, which support protocols for communications between different to-be-tested objects. In an example embodiment, protocols may include SAS Protocol; accordingly, test interfaces may include a SAS interface. In another example embodiment, protocols include FC Protocol; accordingly, test interfaces may include an FC interface. In still another example embodiment, protocols include SATA protocol; accordingly, a test interfaces may include a SATA interface.

In one embodiment, tester 220 may be configured to simulate, under one of a plurality of operation modes, at least one of a plurality of to-be-tested objects so as to test other to-be-tested objects communicating with a simulated to-be-tested object. In one embodiment, to-be-tested objects may at least include two of: a host bus adapter (HBA), a physical storage device, and a storage expansion device coupled between a host bus adapter and a physical storage device. In an example embodiment, a physical storage device may include, but may not be limited to: a hard disk drive (HDD), a solid state disk drive (SSD), and a tape drive. In a further embodiment, a storage expansion device may include, but may not be limited to: a switch.

Figure 3:
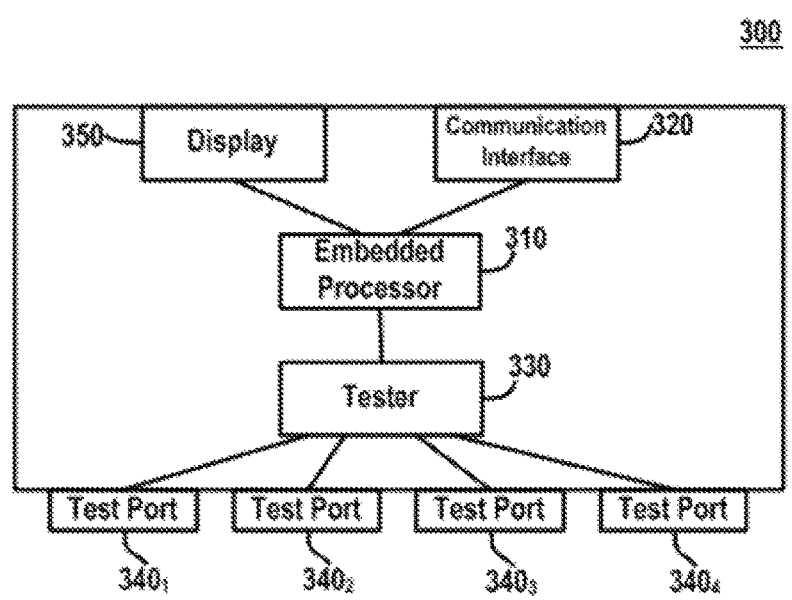
FIG. 3 schematically shows an exemplary block diagram of an embedded computing device which is applicable to implement the embodiments of the present disclosure.

FIG. 3 shows a schematic block diagram of an embedded computing device 300 which is applicable to implement the embodiments of the present invention. As shown in FIG. 3, embedded computing device 300 comprises embedded processor 310. In addition, embedded processor 310 may be coupled to RAM and a flash memory (not shown). Embedded computing device 300 further includes a communication interface 330. Embedded computing device 300 further comprises a tester 320. Tester 320 may be implemented as a controller that supports protocols for communications between different to-be-tested objects. Embedded computing device 300 further comprises test ports $340_1$, $340_2$, $340_3$ and $340_4$ (collectively called test port 340). The number of test ports may be determined in accordance with the number of operation modes of SAS controller 320. Therefore, although FIG. 3 shows four test ports, according to the number of operation modes of SAS controller 320, embedded computing device 300 may include more or less test ports. Each operation mode of SAS controller 320 may be associated with one or more of test ports 340. In addition, test port 340 is configured to support protocols for communications between different to-be-tested objects. Embedded processor 310 may obtain a test request from another specific computing device via communication interface 330 and generate a configuration signal in response to the test request. In addition, embedded processor 310 may further receive a predetermined test case from another specific computing device via communication interface 330, for operation in the test process.

In an example embodiment, embedded processor 310 may include, but are not limited to: MPU, MCU, EDSP, and SoC. In some embodiments, part of RAM may be simulated as a hard disk by software, thereby forming a virtual memory disk (RAMDISK). In some other embodiments, compared with direct access to hard disk file, file access speed may be increased greatly. In some other embodiments, a flash memory may store an operating system and firmware images of embedded computing device 300.

In an example embodiment, communication interface 330 may include, but are not limited to: an Ethernet interface, a USB interface, and a universal asynchronous receiver/transmitter (UART) interface. In some embodiments, examples of protocol may include, but are not limited to: SAS protocol, FC protocol, and SATA protocol. As one example embodiment, in context of a SAS protocol, tester 320 may be implemented as a SAS controller 320. In some other embodiments, SAS controller 320 may be a disk drive controller that supports the SAS protocol. In some other embodiments, SAS controller 320 may be configured to receive a configuration signal from embedded processor 310, and configured to, by a configuration signal, operate under different operation modes so as to test different to-be-tested objects in a storage network. In some other embodiments, examples of protocols may include, but are not limited to: SAS protocol, FC protocol, and SATA protocol. As one example embodiment, in a context of the SAS protocol, test port 340 may be implemented as a SAS port 340.

In a further embodiment, operation modes of SAS controller 320 may at least include a first operation mode and a second operation mode. In a further embodiment, under a first operation mode, SAS controller 320 may be configured to simulate one of a physical storage device (e.g., physical storage device 140 in FIG. 1) or configured to act as a physical storage device so as to test a HBA on a server (e.g., HBA 111 in FIG. 1) or one of storage expansion devices (e.g., storage expansion device 130 or 140 in FIG. 1). In some additional embodiments, a first operation mode of SAS controller 320 may be associated with one of test ports 340, e.g., test port $340_1$.

In some embodiments, a test under a first operation mode, SAS controller 320 may receive a test data stream via test port $340_1$ from, for example, HBA 111 or storage expansion device 130/140, and may send received test data stream to embedded processor 310. In some other embodiments, embedded processor 310 may analyze test data stream to generate a test result. In some other embodiments, test result may be presented to a testing operator by display 350. In some additional embodiment, a test result may also be transferred to another specific computing device via communication interface 320.

In some embodiments, using a test apparatus, in a test under a first operation mode, there may be no need to use an actual physical storage device, e.g., a hard disk drive or a solid state disk drive. In some other embodiments, an extreme test which may be unfeasible using an actual physical storage device may be enabled, for example, stress test of full 12 Gbps data path. In some additional embodiment, it may be understood that if an actual physical storage device is put to extreme test over and again, a service life of a physical storage device may be affected severely. In some other embodiments, with a test apparatus as disclosed, not only an objective of an extreme test may be fulfilled, but also a physical storage device may be prevented from being damaged.

In some embodiments, in a test under a first operation mode, a test data stream from a HBA may be written to RAMDISK in RAM. In some other embodiment, it may be understood if read/write operations are repeatedly performed to an actual physical storage device, a service life of a physical storage device may be affected. In some other embodiment, with a test apparatus as disclosed, it may be possible to avoid reducing a service life of a physical storage device due to a test.

In some embodiments, in a test under a first operation mode, physical storage devices with various data rates (e.g., 3 Gbps, 6 Gbps or 12 Gbps) may be simulated. In some other embodiments, frequent replacement of actual physical storage devices may be avoided, and a test may be made more convenient.

In some embodiments, under a second operation mode, SAS controller 320 may be configured to simulate a HBA (e.g., HBA 111 in FIG. 1) on a server so as to test one of a physical storage devices (e.g., physical storage device 120 in FIG. 1) or one of a storage expansion devices (e.g., storage expansion device 130 or 140 in FIG. 1). casein some other embodiments, a second operation mode of SAS controller 320 may be associated with test port $340_2$, for example. In some embodiments, in a test under a second operation mode, embedded processor 310 may run a predetermined test case to generate a corresponding test data stream. In some other embodiments, SAS controller 320 may send a test data stream via test port $340_2$ to physical storage device 120 or storage expansion device 130/140, and may receive a response data stream with respect to a test data stream from physical storage device 120 or storage expansion device 130/140. In some other embodiments, SAS controller 320 may send a received response data stream to embedded processor 310. In some embodiments, embedded processor 310 may analyze a response data stream to generate a test result.

In certain embodiments, a test apparatus as disclosed may include a standard connector following a protocol (e.g., the SAS protocol). In certain other embodiments, under a second operation mode, a test apparatus may be easily connected to a server via a connector, thereby getting electric power from a server without being connected to an external power supply. In certain other embodiments, a test apparatus as disclosed may be determined to have a same size as a physical storage device, for example, 2.5 or 3.5 inches, and thereby may be convenient to be coupled to a physical storage device and/or a storage expansion device.

In some embodiments, under a third operation mode, SAS controller 320 may be configured to simulate both a HBA (e.g., HBA 111 in FIG. 1) on a server and a physical storage device (e.g., physical storage device 120 in FIG. 1) so as to test one of a storage expansion devices (e.g., storage expansion device 130 or 140 in FIG. 1). In some other embodiments, a third operation mode of SAS controller 320 may be associated with test ports $340_3$ and $340_4$, for example.

In some other embodiments, for a test under a third operation mode, embedded processor 310 may run a predetermined test case to generate a corresponding test data stream. In some other embodiments, SAS controller 320 may send a test data stream via test port $340_2$ to storage expansion device 130/140, and may receive a response data stream with respect to a test data stream from storage expansion device 130/140. In some other embodiments, SAS controller 320 may send a received response data stream to embedded processor 310. In some other embodiments, embedded processor 310 may analyze a response data stream to generate a test result. In some embodiments, under the third operation mode, a plurality of test apparatuses of as disclosed may be coupled to storage expansion devices to implement multi-initiators test or loopback test with respect to storage expansion devices.

In certain embodiments, in order to facilitate understanding, description is presented below to operations of tester 330 under different operation modes with reference to FIGS. 1 and 3. In certain embodiments, as described above, however, to-be-tested objects may also communicate based on other protocol than a SAS protocol. In certain other embodiments, operations of tester 330 may vary with specific protocols, and the scope of the present disclosure is not limited in this regard.

In an example embodiment, with reference to FIG. 3 for example, tester 330 may be configured to simulate, under a first operation mode, physical storage device 120 or storage expansion device 130/140 so as to test HBA 111 on server 110. In some embodiments, it may be understood that at a protocol layer, a SAS protocol may include three types of protocols by which data transmission proceeds according to the connected device: (1) Serial SCSI Protocol (SSP) for transmitting SCSI instructions; (2) SCSI Management Protocol (SMP) for maintaining and managing a connected device; (3) SATA Tunneling Protocol (STP) for data transmission between a SAS device and a SATA device.

In certain embodiments, under a first operation mode, tester 330 may test HBA 111 based on an SMP and/or SSP to determine whether HBA 111 may achieve a maximum rate, a maximum IO speed and/or a physical signal quality, etc. In an example embodiment of SMP, HBA 111 may send various SMP sub-pages to tester 330 at a desired rate, for example, 3 Gbps, 6 Gbps or 12 Gbps. In certain embodiments, tester 330 may receive an SMP sub-page through test port 340$_1$, may record any error in an I/O process and may send recorded content to processor 310. In certain other embodiments, processor 310 may analyze content received from tester 330 to generate a test result. In one example embodiment, processor 310 may organize a test result into a file so as to store the file in a local memory, for example a flash memory. In another example embodiment, processor 310 may present a test result to a testing operator through an input/output device, for example display 350 in FIG. 3. In one further example embodiment, processor 310 may transfer a test result to a specific computing device through a communication interface, for example communication interface 320 in FIG. 3.

In an example embodiment of an SSP, HBA 111 may send I/O frames with different patterns to tester 330 at desired speed, for example, 3 Gbps, 6 Gbps or 12 Gbps. In a further embodiment, tester 330 may monitor speed of various physical ports (phy) of test port 340$_1$, may record any error in I/O process and may send recorded content to processor 310. In a further embodiment, processor 310 may analyze content received from tester 330 to generate a test result.

In some embodiments, under a second operation mode, tester 330 may test physical storage device 120 or storage expansion device 130/140 based on an SMP and/or SSP, and may perform special I/O stress test to physical storage device 120 or storage expansion device 130/140 to determine whether physical storage device 120 or storage expansion device 130/140 may achieve desired I/O response speed and/or response capability. In an example embodiment of an SMP, tester 330 may send various SMP frames through test port 340$_2$ to physical storage device 120 or storage expansion device 130/140. In a further embodiment, tester 330 may receive responses to various SMP frames from physical storage device 120 or storage expansion device 130/140, to test whether physical storage device 120 or storage expansion device 130/140 supports various frames. In an additional embodiment, tester 330 may record any error in an I/O process and may send recorded content to processor 310. In a further embodiment, processor 310 may analyze content received from tester 330 to generate a test result.

In one example embodiment of stress test, tester 330 may send I/O stresses with various patterns to physical storage device 120 or storage expansion device 130/140 and may receive responses with respect to various I/O stresses from physical storage device 120 or storage expansion device 130/140, through test port 340$_2$. In an additional embodiment, tester 330 may record any error in an I/O process and may send recorded content to processor 310. In a further embodiment, processor 310 may analyze content received from tester 330 to generate a test result.

In another example embodiment of stress test, tester 330 may perform different I/O stress tests to physical storage device 120 or storage expansion device 130/140 to verify whether physical storage device 120 or storage expansion device 130/140 supports all data frames. In an additional embodiment, tester 330 may record any error in a I/O process and may send recorded content to processor 310. In a further embodiment, processor 310 may analyze content received from tester 330 to generate a test result.

In some embodiments, under a third operation mode, tester 330 may test storage expansion device 130/140 based on an SMP protocol and/or SSP protocol and perform special I/O stress tests. In an example embodiment, a plurality of testers 330 may be used to perform I/O stress tests to multiple specific physical ports (phy) of storage expansion device 130/140. In an additional embodiment, testers 330 may record any error in a I/O process and may send recorded content to processor 310. In some other embodiments, processor 310 may analyze content received from tester 330 to generate a test result.

In certain embodiments, it should be understood that individual components in test apparatuses 200 and 300 may be hardware modules or software unit modules. In an example embodiment, processor 210/310, tester 220/330, communication interface 320 and test port 340 may be partially or completely implemented using hardware, for example, implemented as an integrated circuit (IC), a dedicated integrated circuit (ASIC), a system on chip (SOC), a field programmable gate array (FPGA), and the like. Alternatively or additionally, in some embodiments, processor 210/310, tester 220/330, communication interface 320 and test port 340 may be partially or completely implemented using software and/or firmware, for example, implemented as a computer program product embodied on a computer readable medium.

In an additional embodiment, it should be understood that appropriate test cases may be selected to run according to specific test needs under different operation modes, and the scope of the present invention is not limited in this regard. In an additional embodiment, although a test process may be described with reference to a storage network architecture in FIG. 1, a test apparatus of the present disclosure may be applicable to storage networks having any architectures, including but being not limited to: a storage network with SAN (storage area network) architecture, and a storage network with NAS (network attached storage) architecture.

Figure 4:
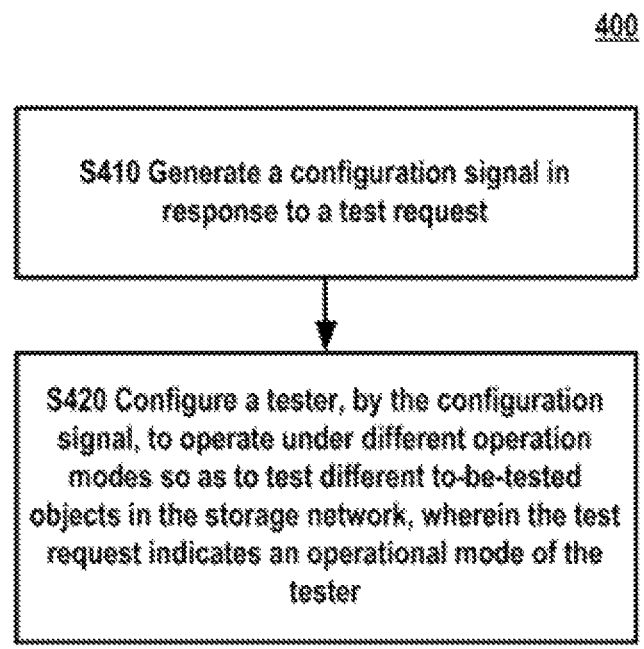
FIG. 4 shows an exemplary flowchart of a method for testing a storage network according to one embodiment of the present disclosure.

Reference is now made to FIG. 4, which shows a flowchart of a method 400 for testing a storage network according to one embodiment of the present invention. In step S410, a configuration signal is generated in response to a test request. In step S420, a tester is configured to, by the configuration signal, operate under different operation modes so as to test different to-be-tested objects in the storage network. The test request indicates an operation mode of the tester.

In one embodiment, step S420 may include under one of the operation modes, simulating at least one to-be-tested object of a to-be-tested objects so as to test other to-be-tested objects communicating with a simulated to-be-tested object. In one embodiment, step S420 may include under one of the operation modes, simulating two to-be-tested objects of to-be-tested objects so as to test other to-be-tested objects communicating with two simulated to-be-tested objects. In one embodiment, step S420 may include testing an object based on protocols for communications between different to-be-tested objects.

In one embodiment, a tester may include at least one test port configured to transfer a test signal to to-be-tested objects and/or receive a response to a test signal from to-be-tested objects. In some embodiments, method 400 may include associating each of the test ports with one of the operation modes. In one embodiment, associating each of the test ports with one of the operation modes may include generating another configuration signal in response to a configuration request; and associating each of the test ports with one of the operation modes with the another configuration signal, wherein a configuration request indicates one of the operation modes. As one example embodiment, a configuration request may be received via communication interface 320 in FIG. 3. In a further embodiment, embedded processor 310 may generate another configuration signal in response to a configuration request, and associates each of the test ports with one of the operation modes with another configuration signal.

In one embodiment, a protocol may include any one of: Serial Attached Small Computer System Interface (SAS) Protocol, Fibre Channel (FC) Protocol, and Serial Advanced Technology Attachment (SATA) Protocol. In one embodiment, to-be-tested objects may at least include two of: a host bus adapter (HBA); a physical storage device; and a storage expansion device coupled between a host bus adapter and a physical storage device.

In certain embodiments, it should be understood that steps of method 400 may be executed by apparatuses 200 and 300 described with reference to FIGS. 2 and 3 respectively. In certain other embodiments, features described with reference to FIGS. 2 and 3 may also be applicable to method 400 and have the same effects and have already been discussed in detailed above.

In one embodiment, there is provided a computer program product, the computer program product being tangibly stored on a non-transient computer readable storage medium and comprising machine executable instructions which, when executed, cause a machine to execute steps of the method described above.

In one embodiment, a computer readable storage medium may be a tangible device that may store instructions used by an instruction execution device. In a further embodiment, a computer readable storage medium may include, but may be not limited to, for example, an electronic storage device, a magnetic storage device, an optical storage device, an electromagnetic storage device, a semiconductor storage device, or any suitable combination thereof. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination thereof. A computer readable storage medium, as used herein, is not to be construed as being transitory signals per se, such as radio waves or other electromagnetic waves freely propagating, electromagnetic waves propagating through a waveguide or other transmission media (e.g., light pulses passing through a fiber-optic cable), or electrical signals transmitted through a wire.

Computer program instructions for implementing operations of the present disclosure may be assembler instructions, instruction-set-architecture (ISA) instructions, machine instructions, machine dependent instructions, microcode, firmware instructions, state-setting data, or either source code or object code written in any combination of one or more programming languages, including an object oriented programming language such as Java, Smalltalk, C++, and the like, and conventional procedural programming languages, such as the "C" programming language or similar programming languages. The computer readable program instructions may be executed completely on the user's computer, partly on the user's computer, as a stand-alone software package, partly on the user's computer and partly on a remote computer, or completely on the remote computer or server. In the case involving the remote computer, the remote computer may be connected to the user's computer through any type of network, including a local area network (LAN) or a wide area network (WAN), or may be connected to an external computer (for example, through the Internet using an Internet Service Provider). In some embodiments, electronic circuitry, such as programmable logic circuitry, field-programmable gate arrays (FPGA), or programmable logic arrays (PLA), may be customized by utilizing state information of the computer readable program instructions, which may execute the computer readable program instructions in order to perform aspects of the present invention.

Aspects of the present disclosure are described herein with reference to flowcharts and/or block diagrams of the device, method, and computer program product according to embodiments of the present invention. It will be understood that each block of the flowcharts and/or block diagrams, and combinations of blocks in the flowcharts and/or block diagrams may be implemented by computer readable program instructions.

Various embodiments of the present disclosure have been described above for the purpose of illustration. However, the present disclosure is not intended to limit these embodiments as disclosed. Without departing from the essence of the present disclosure, all modifications and variations fall into the protection scope of the present disclosure defined by the claims.

What is claimed is:

1. An apparatus for testing a device within a storage network, comprising:
   a plurality of test ports;
   a processor configured to generate a configuration signal in response to receiving a test request; and
   a tester coupled to the processor and configured to, by the configuration signal, operate under diverse operation modes to test different to-be-tested objects on a device within the storage network; wherein the test request indicates an operation mode of the tester;
   wherein the to-be-tested objects at least comprise two of the following:
      a host bus adapter (HBA);
      a physical storage device; and
      a storage expansion device coupled between the host bus adapter and the physical storage device.

2. The apparatus according to claim 1, wherein the tester is further configured to simulate, under one of the operation modes, at least one to-be-tested object of the to-be-tested objects to test other to-be-tested objects communicating with a simulated to-be-tested object.

3. The apparatus according to claim 1, wherein the tester is configured to support a communication protocol between different to-be-tested objects.

4. The apparatus according to claim 1, wherein the tester further comprises:
   at least one test port configured to transfer a test signal to the to-be-tested objects and receive a response to the test signal from the to-be-tested objects; wherein each of the test ports is associated with one of the operation modes.

5. The apparatus according to claim 4, wherein the test ports comprise at least one of the following: a Serial Attached Small Computer System Interface (SAS) port, a Fibre Channel (FC) port, and a Serial Advanced Technology Attachment (SATA) port.

6. The apparatus according to claim 1, wherein the processor comprises an embedded processor.

7. A method for testing a device within a storage network, the method comprising:
generating a configuration signal in response to a test request; and
configuring a tester, wherein the tester is communicatively coupled to a plurality of ports, by the configuration signal, to operate under diverse operation modes to test different to-be-tested objects on a device within the storage network; wherein the test request indicates an operation mode of the tester;
wherein the to-be-tested objects at least comprise two of the following:
a host bus adapter (HBA);
a physical storage device; and
a storage expansion device coupled between the host bus adapter and the physical storage device.

8. The method according to claim 7, wherein testing different to-be-tested objects in the storage network comprises: under one of the operation modes, simulating at least one to-be-tested object of the to-be-tested objects to test other to-be-tested objects communicating with a simulated to-be-tested object.

9. The method according to claim 7, wherein the tester is configured to support a communication protocol between different to-be-tested objects.

10. The method according to claim 7, wherein the tester further comprises:
at least one test port configured to transfer a test signal to the to-be-tested objects and receive a response to the test signal from the to-be-tested objects; and
associating each of the test ports with one of the operation modes.

11. The method according to claim 10, wherein the associating each of the test ports with one of the operation modes comprises:
generating another configuration signal in response to a configuration request; and associating each of the test ports with one of the operation modes with the another configuration signal, wherein the configuration request indicates one of the operation modes.

12. The method according to claim 9, wherein the protocol comprises at least one of the following: Serial Attached Small Computer System Interface (SAS) Protocol, Fibre Channel (FC) Protocol, and Serial Advanced Technology Attachment (SATA) Protocol.

13. A computer program product, the computer program product being tangibly stored on a non-transient computer readable storage medium and comprising machine executable instructions which, when executed, cause the machine to generate a configuration signal in response to a test request; and
a tester, communicatively coupled to a plurality of test ports, configured to, by the configuration signal, operate under diverse operation modes to test different to-be-tested objects on a device within the storage network; wherein the test request indicates an operation mode of a tester;
wherein the to-be-tested objects at least comprise two of the following:
a host bus adapter (HBA);
a physical storage device; and
a storage expansion device coupled between the host bus adapter and the physical storage device.

14. The computer program product according to claim 13, further configured to simulate, under one of the operation modes, at least one to-be-tested object of the to-be-tested objects to test other to-be-tested objects communicating with a simulated to-be-tested object.

15. The computer program product according to claim 13, wherein the tester is configured to support a communication protocol between different to-be-tested objects.

16. The computer program product according to claim 13, wherein the tester further comprises:
at least one test port configured to transfer a test signal to the to-be-tested objects and receive a response to the test signal from the to-be-tested objects; wherein each of the test ports is associated with one of the operation modes.

17. The computer program product according to claim 16, wherein the test ports comprise at least one of the following: a Serial Attached Small Computer System Interface (SAS) port, a Fibre Channel (FC) port, and a Serial Advanced Technology Attachment (SATA) port.

18. The computer program product according to claim 13, wherein the processor comprises an embedded processor.

* * * * *